(12) United States Patent
Ramaswamy et al.

(10) Patent No.: US 8,169,032 B2
(45) Date of Patent: *May 1, 2012

(54) GATE STACKS AND SEMICONDUCTOR CONSTRUCTIONS

(75) Inventors: D. V. Nirmal Ramaswamy, Boise, ID (US); Venkatesan Ananthan, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 12/938,114

(22) Filed: Nov. 2, 2010

(65) Prior Publication Data

US 2011/0042754 A1 Feb. 24, 2011

Related U.S. Application Data

(63) Continuation of application No. 12/431,491, filed on Apr. 28, 2009, now Pat. No. 7,851,869.

(51) Int. Cl.
*H01L 29/78* (2006.01)
*H01L 27/092* (2006.01)

(52) U.S. Cl. ........... 257/369; 257/288; 257/E29.255; 257/E27.062

(58) Field of Classification Search .......... 257/288, 257/369, E29.255, E27.062
See application file for complete search history.

(56) References Cited

U.S. PATENT DOCUMENTS

| 5,665,615 | A | 9/1997 | Anmo | |
|---|---|---|---|---|
| 6,265,292 | B1 | 7/2001 | Parat et al. | |
| 7,501,673 | B2* | 3/2009 | Park et al. | 257/288 |
| 7,851,869 | B2* | 12/2010 | Ramaswamy et al. | 257/369 |
| 2004/0180487 | A1* | 9/2004 | Eppich et al. | 438/199 |

* cited by examiner

*Primary Examiner* — Matthew W Such
*Assistant Examiner* — Monica D Harrison
(74) *Attorney, Agent, or Firm* — Wells St. John P.S.

(57) ABSTRACT

The invention includes methods of forming PMOS transistors and NMOS transistors. The NMOS transistors can be formed to have a thin silicon-containing material between a pair of metal nitride materials, while the PMOS transistors are formed to have the metal nitride materials directly against one another. The invention also includes constructions which contain an NMOS transistor gate stack having a thin silicon-containing material between a pair of metal nitride materials. The silicon-containing material can, for example, consist of silicon, conductively-doped silicon, or silicon oxide; and can have a thickness of less than or equal to about 30 angstroms.

7 Claims, 5 Drawing Sheets

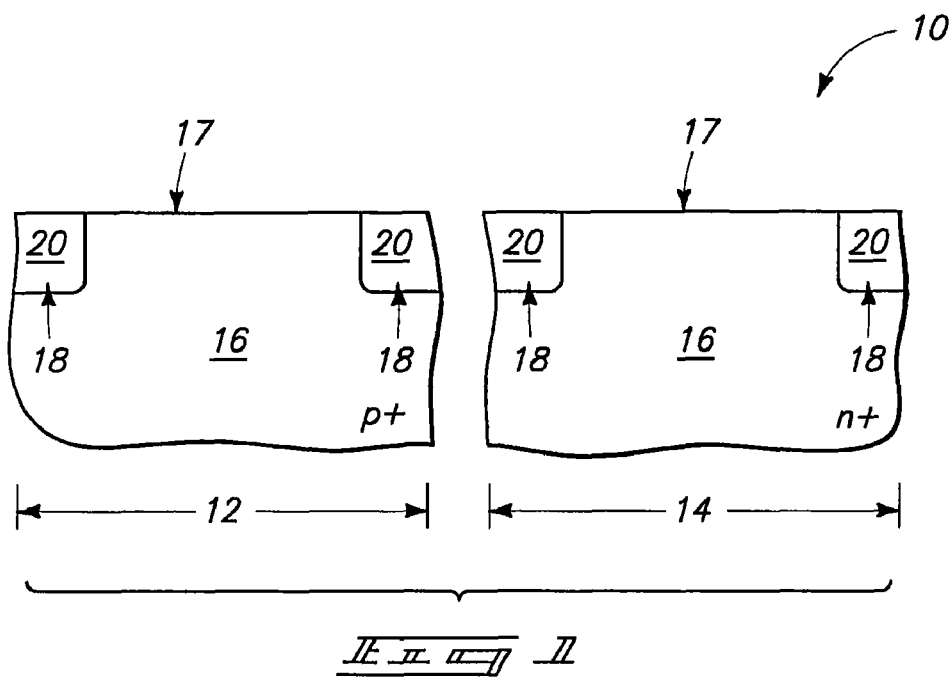
F I G 1
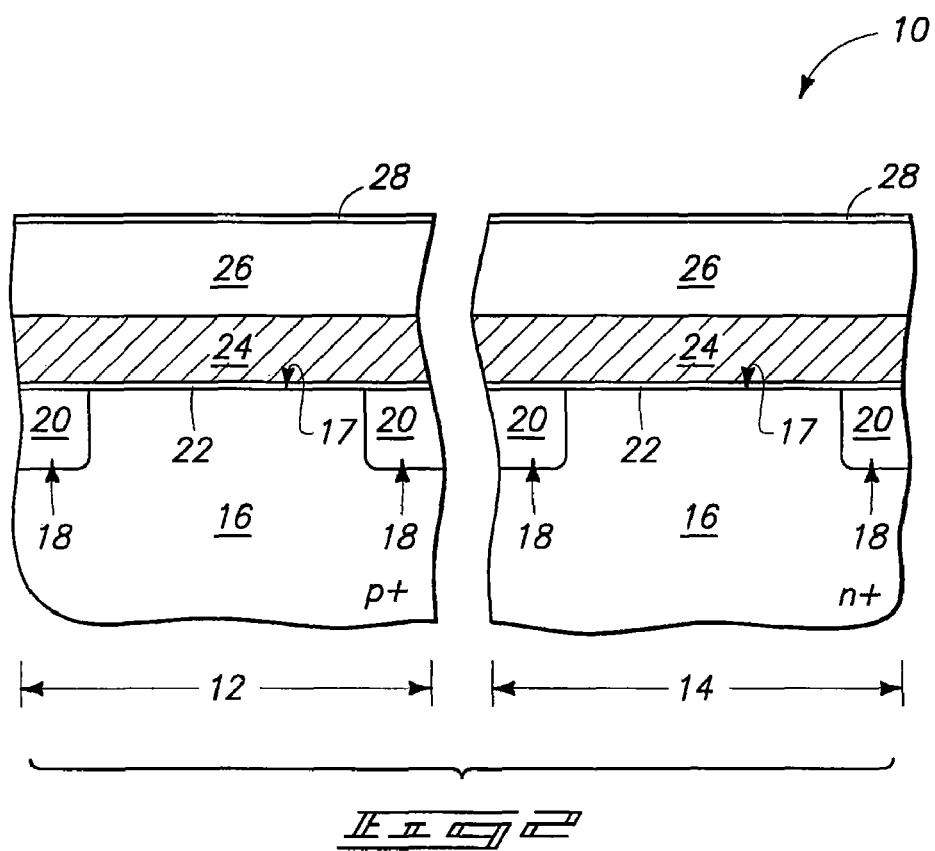
F I G 2

GATE STACKS AND SEMICONDUCTOR CONSTRUCTIONS

RELATED PATENT DATA

This patent resulted from a continuation of U.S. patent application Ser. No. 12/431,491, which was filed Apr. 28, 2009, and which is hereby incorporated herein by reference; which is a divisional of U.S. patent application Ser. No. 11/370,676, which was filed Mar. 7, 2006, which issued as U.S. Pat. No. 7,544,559, and which is hereby incorporated herein by reference.

TECHNICAL FIELD

The invention pertains to semiconductor constructions, and to methods of forming semiconductor constructions.

BACKGROUND OF THE INVENTION

Transistors are commonly utilized in integrated circuitry. For instance, transistors can be utilized in memory arrays, and/or in logic circuitry peripheral to a memory array. Two common types of transistors are p-type metal-oxide-semiconductor field effect transistors (PMOSFETs) and n-type metal-oxide-semiconductor field effect transistors (NMOSFETs). PMOSFETs can be referred to as PMOS transistors, and NMOSFETs can be referred to as NMOS transistors. In some applications, an NMOS transistor can be paired with a PMOS transistor in a complementary metal-oxide-semiconductor (CMOS) assembly.

A continuing goal of semiconductor processing is to reduce process steps. Accordingly, it can be desired to utilize common process steps for fabrication of portions of NMOS transistors and PMOS transistors, so that portions of the NMOS transistors can be fabricated simultaneously with portions of the PMOS transistors.

It is also a continuing goal to fabricate transistors tailored for the particular applications of the transistors, and specifically to tailor the work functions of the transistors.

It would be desired to develop methods of semiconductor fabrication which can simultaneously form portions of NMOS transistors and portions of PMOS transistors, while also enabling work functions of the various transistors to be tailored for the applications of the transistors.

SUMMARY OF THE INVENTION

In one aspect, the invention includes a method of forming a semiconductor construction. A semiconductor substrate is provided, with the substrate having a defined PMOS region and a defined NMOS region. An NMOS gate stack is formed over the NMOS region. The NMOS gate stack comprises a vertical segment consisting of, in ascending order from the substrate: gate dielectric, first metal nitride, silicon-containing material, and second metal nitride. The silicon-containing material is less than or equal to about 30 angstroms thick. A PMOS gate is formed over the PMOS region. The PMOS gate comprises a vertical segment consisting of, in ascending order from the substrate: the gate dielectric, the first metal nitride, and the second metal nitride.

In one aspect, the invention includes another method of forming a semiconductor construction. A semiconductor substrate is provided to have a defined PMOS region and a defined NMOS region. A silicon-containing material is formed across the PMOS and NMOS regions. Ammonium hydroxide is utilized to remove the silicon-containing material from over the PMOS region. Tetramethylammonium hydroxide is utilized to thin the silicon-containing material over the NMOS region. A PMOS transistor is formed to be associated with the PMOS region, and an NMOS transistor is formed to be associated with the NMOS region. The NMOS transistor comprises a gate stack containing the thinned silicon-containing material.

In one aspect, the invention includes yet another method of forming a semiconductor construction. A semiconductor substrate is provided, with the substrate having a defined PMOS region and a defined NMOS region. Gate dielectric is formed across the PMOS and NMOS regions. First metal nitride is formed over the gate dielectric and across the PMOS and NMOS regions. A silicon-containing material is formed over the metal nitride and across the PMOS and NMOS regions. The silicon-containing material over the PMOS region is exposed to ammonium hydroxide to remove the silicon-containing material from over the PMOS region. The silicon-containing material over the NMOS region is protected during the exposure to the ammonium hydroxide so that the silicon-containing material remains over the NMOS region after the removal of the silicon-containing material from over the PMOS region. The silicon-containing material over the NMOS region is exposed to tetramethylammonium hydroxide to thin the silicon-containing material remaining over the NMOS region to a thickness of less than or equal to about 30 angstroms. After the exposure to the tetramethylammonium hydroxide, second metal nitride is formed over the PMOS and NMOS regions. The gate dielectric, first metal nitride and second metal nitride are patterned into a PMOS gate stack over the PMOS region. The gate dielectric, first metal nitride, thin silicon-containing material and second metal nitride are patterned into an NMOS gate stack over the NMOS region.

In one aspect, the invention includes a semiconductor construction. The construction contains a semiconductor substrate, and an NMOS gate stack supported by the substrate. The NMOS gate stack includes a vertical segment consisting of, in ascending order from the substrate: gate dielectric, first metal nitride, silicon-containing material, and second metal nitride. The silicon-containing material is less than or equal to about 30 angstroms thick. The construction also includes a channel region within the substrate adjacent the gate dielectric, and a pair of conductively-doped source/drain regions gatedly connected to one another through the channel region. The NMOS gate stack, channel region and source/drain regions together are comprised by an NMOS transistor.

In one aspect, the invention includes another semiconductor construction. The construction contains a semiconductor substrate having a PMOS region and an NMOS region. An NMOS gate stack is over the NMOS region, and a PMOS gate stack is over the PMOS region. The NMOS gate stack includes a vertical segment consisting of, in ascending order from the substrate: gate dielectric, first metal nitride, silicon-containing material, and second metal nitride. The silicon-containing material is less than equal to about 30 angstroms thick. The PMOS gate stack includes a vertical segment consisting of, in ascending order from the substrate: the gate dielectric, the first metal nitride, and the second metal nitride.

BRIEF DESCRIPTION OF THE DRAWINGS

Preferred embodiments of the invention are described below with reference to the following accompanying drawings.

FIG. 1 is a diagrammatic, cross-sectional view of a pair of fragments of a semiconductor construction shown at a preliminary processing stage of an exemplary aspect of the present invention.

FIG. 2 is a view of the fragments of FIG. 1 shown at a processing stage subsequent to that of FIG. 1.

DETAILED DESCRIPTION OF THE PREFERRED EMBODIMENTS

Figure 3:
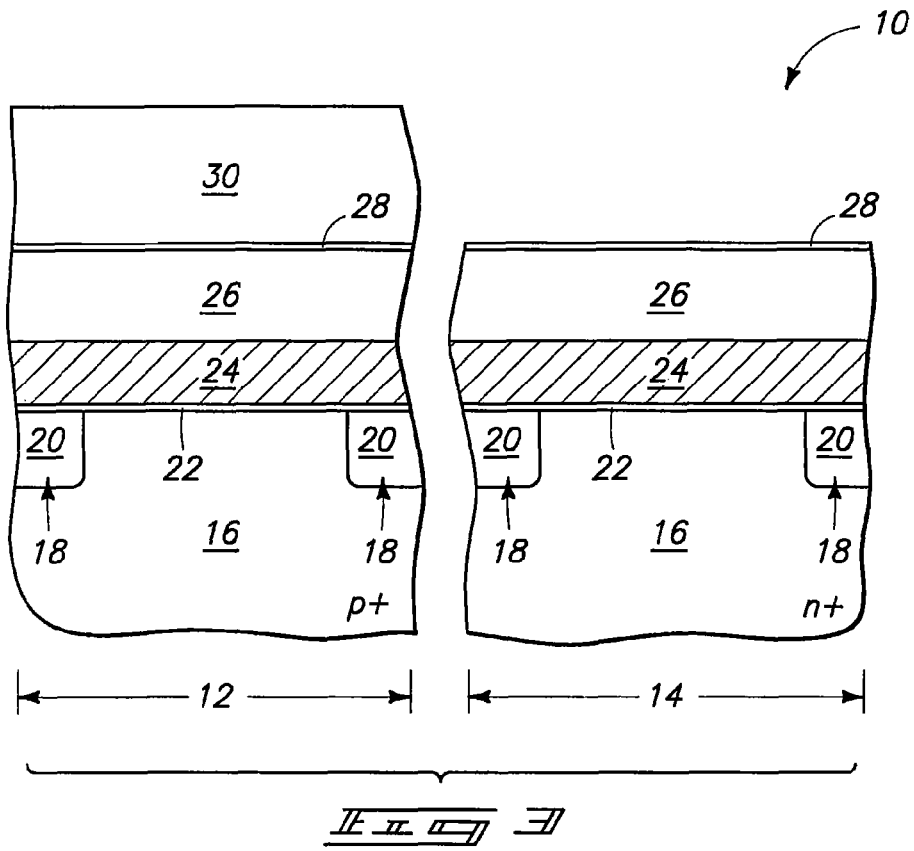
FIG. 3 is a view of the fragments of FIG. 1 shown at a processing stage subsequent to that of FIG. 2.

This disclosure of the invention is submitted in furtherance of the constitutional purposes of the U.S. Patent Laws "to promote the progress of science and useful arts" (Article 1, Section 8).

The invention includes methods of incorporating thin layers of silicon-containing material into NMOS gate stacks to adjust the work function of NMOS transistors. The silicon-containing material can, for example, consist of silicon, conductively-doped silicon, or silicon oxide ($SiO_x$, where "x" is less than or equal to 2). In particular aspects, the silicon-containing material can be a single monolayer thick, or only a few monolayers thick; with the silicon-containing material typically being less than or equal to 30 angstroms thick; and in particular aspects being from about 10 angstroms thick to about 30 angstroms thick.

The thin silicon-containing material can be between two metal-containing layers (such as, for example, two metal nitride layers). The presence of a few monolayers of silicon-containing material within an NMOS transistor can shift the work function by about 650 mV.

It can be preferred that the silicon-containing material be very thin. If the silicon-containing material becomes greater than just a few monolayers thick, the high-frequency response of a CV curve can deteriorate.

Exemplary aspects of the invention are described below with reference to FIGS. 1-10.

Referring to FIG. 1, a semiconductor construction 10 is illustrated at a preliminary processing stage. The construction is shown to comprise a pair of segments 12 and 14, which are illustrated as being separate fragments.

The segments 12 and 14 comprise a substrate 16. Substrate 16 can comprise, consist essentially of, or consist of, for example, monocrystalline silicon lightly-doped with appropriate background dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

The substrate of segment 12 is background-doped with p-type dopant, and the substrate of segment 14 is background-doped with an n-type dopant. In some aspects, segment 12 can be considered to comprise a defined NMOS region of substrate 16, and segment 14 can be considered to comprise a defined PMOS region of the substrate.

Isolation regions 18 are provided within substrate 16. The isolation regions comprise electrically insulative material 20. Such material can, for example, comprise, consist essentially of, or consist of silicon dioxide. The isolation regions can be any suitable isolation regions, and in some aspects can correspond to shallow trench isolation regions.

Substrate 16 has a planarized upper surface 17 extending across segments 12 and 14. In some aspects, substrate 16 can correspond to bulk monocrystalline silicon, and accordingly surface 17 can be an upper surface of a monocrystalline silicon wafer.

Referring to FIG. 2, a stack of materials 22, 24, 26 and 28 is formed across the PMOS region and the NMOS region.

Material 22 is electrically insulative gate dielectric, and can comprise any suitable composition or combination of compositions. In some aspects, material 22 can comprise, consist essentially of, or consist of silicon dioxide. In the shown aspect, material 22 is formed directly against the upper surface 17 of substrate 16. The gate dielectric can be formed to a thickness of, for example, about 50 angstroms.

Material 24 is electrically conductive, and can comprise any suitable composition or combination of compositions. In some aspects, material 24 is a metal-containing layer. For instance, material 24 can comprise, consist essentially of, or consist of metal nitride; with exemplary metal nitrides being titanium nitride and tungsten nitride. Although conductive material 24 is shown to be homogeneous, it is to be understood that the invention also includes aspects in which the conductive material 24 comprises two or more layers of differing composition relative to one another. In some aspects, layer 24 can consist essentially of, or consist of metal nitride, and can be formed to a thickness of less than or equal to about 100 angstroms, with a typical thickness being from about 10 angstroms to about 60 angstroms, and an exemplary thickness being from about 50 angstroms to about 60 angstroms. In one aspect, material 24 can comprise a first layer of titanium nitride formed to thickness of about 50 angstroms, and a second layer of tungsten nitride overlying the titanium nitride and formed to thickness of about 20 angstroms.

In the shown aspect of the invention, material 24 is formed directly against an uppermost surface of gate dielectric 22.

Material 26 is a silicon-containing material formed directly against an uppermost surface of material 24. Material 26 can comprise, consist essentially of, or consist of silicon. The silicon of material 26 may or may not be conductively-doped. Material 26 can be formed to any suitable thickness, and in some aspects can be formed to a thickness of greater than about 150 angstroms; with a typical thickness being from about 150 angstroms to about 700 angstroms. The silicon of material 26 can be in any suitable physical form. Material 26 can, for example, comprise, consist essentially of, or consist of one or more of amorphous silicon, polycrystalline silicon, or monocrystalline silicon.

As will become clear from the discussion that follows, material 26 is ultimately thinned to form a very thin silicon-containing material within an NMOS transistor gate stack. An advantage of forming the material 26 to be thick, and subsequently thinning the material, is that it can be easier to form a thick material of silicon having uniform properties throughout than to try to deposit a very thin material having uniform and consistent properties.

Material 28 is a protective oxide layer formed directly against an uppermost surface of material 26, and can comprise, consist essentially of, or consist of silicon dioxide. Material 28 can be formed by thermal oxidation of an uppermost region of silicon-containing material 26. In some aspects, material 28 can correspond to native oxide spontaneously forming over silicon-containing material 26 as the silicon-containing material is exposed to air.

Referring to FIG. 3, photoresist 30 is patterned to be across the NMOS region of segment 12, and not over the PMOS region of segment 14.

Figure 4:
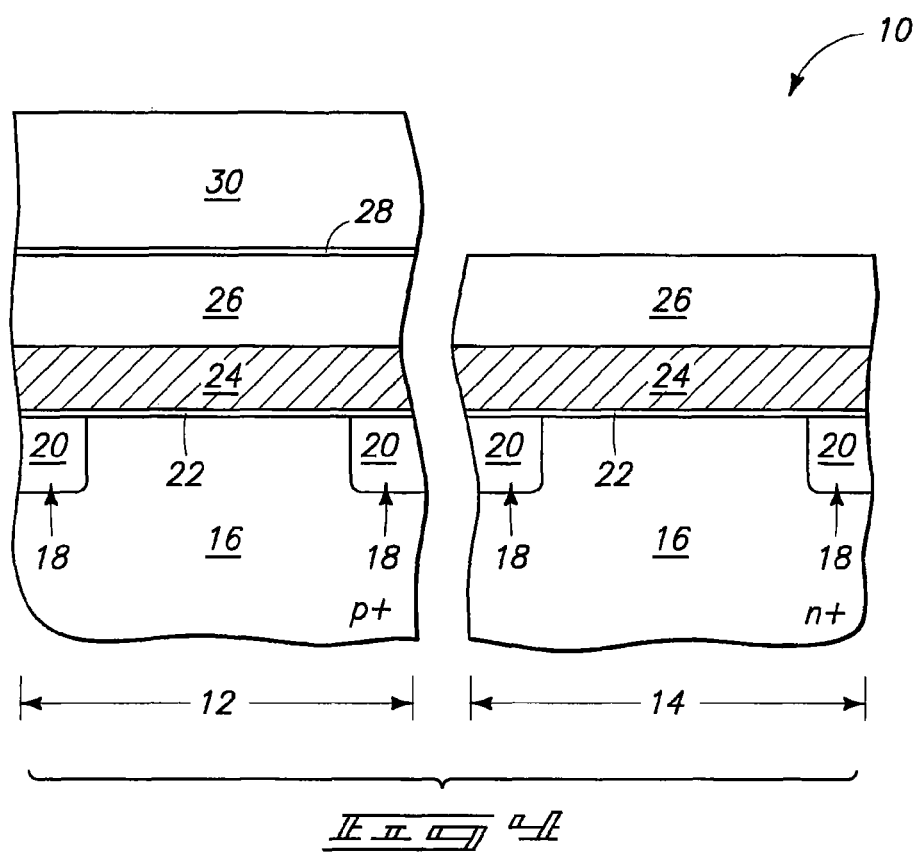
FIG. 4 is a view of the fragments of FIG. 1 shown at a processing stage subsequent to that of FIG. 3.

Referring to FIG. 4, the oxide 28 is removed from over segment 14 (in other words, from over the PMOS region of the substrate), while the NMOS region is protected with patterned photoresist 30. Such removal exposes silicon-containing material 26 of the PMOS region.

Figure 5:
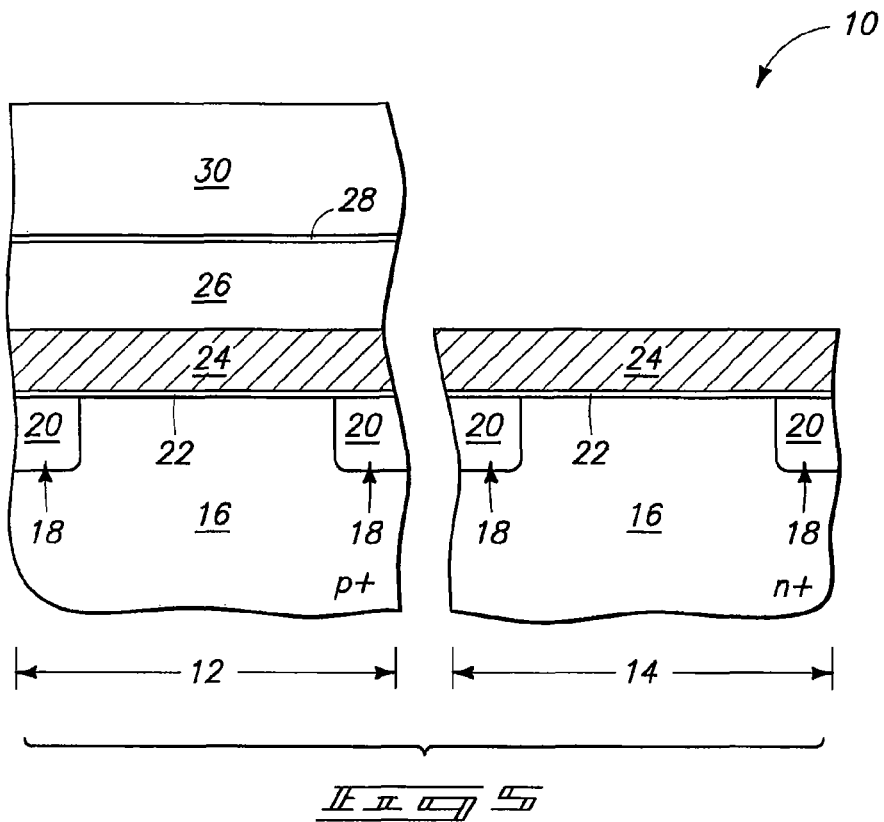
FIG. 5 is a view of the fragments of FIG. 1 shown at a processing stage subsequent to that of FIG. 4.

Referring to FIG. 5, silicon-containing material 26 is removed from over the PMOS region with a suitable etch. In typical aspects of the invention, such etch will utilize ammonium hydroxide ($NH_4OH$), and will be conducted with a dip into an ammonium hydroxide solution. The ammonium hydroxide can be utilized at a concentration of from about 1% to about 20% (by weight), with the dip being conducted for a time of from about one second to about one minute, at a temperature of from about 40° C. to about 65° C.

Photoresist 30 protects materials associated with segment 12 (in other words, the NMOS region) during the exposure of the PMOS region to the ammonium hydroxide.

The ammonium hydroxide is an aggressive etch for silicon-containing material 26, and accordingly removes an entirety of such material from the PMOS region of segment 14.

Figure 6:
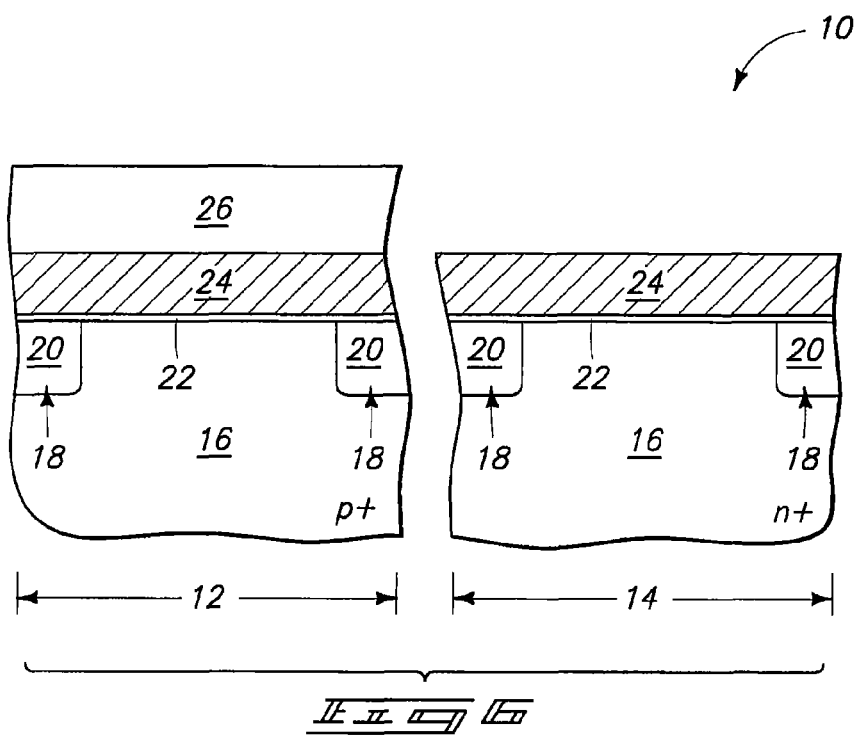
FIG. 6 is a view of the fragments of FIG. 1 shown at a processing stage subsequent that of FIG. 5.

Referring to FIG. 6, photoresist 30 (FIG. 5) and protective oxide 28 (FIG. 5) are removed from over the NMOS region of segment 12.

Figure 7:
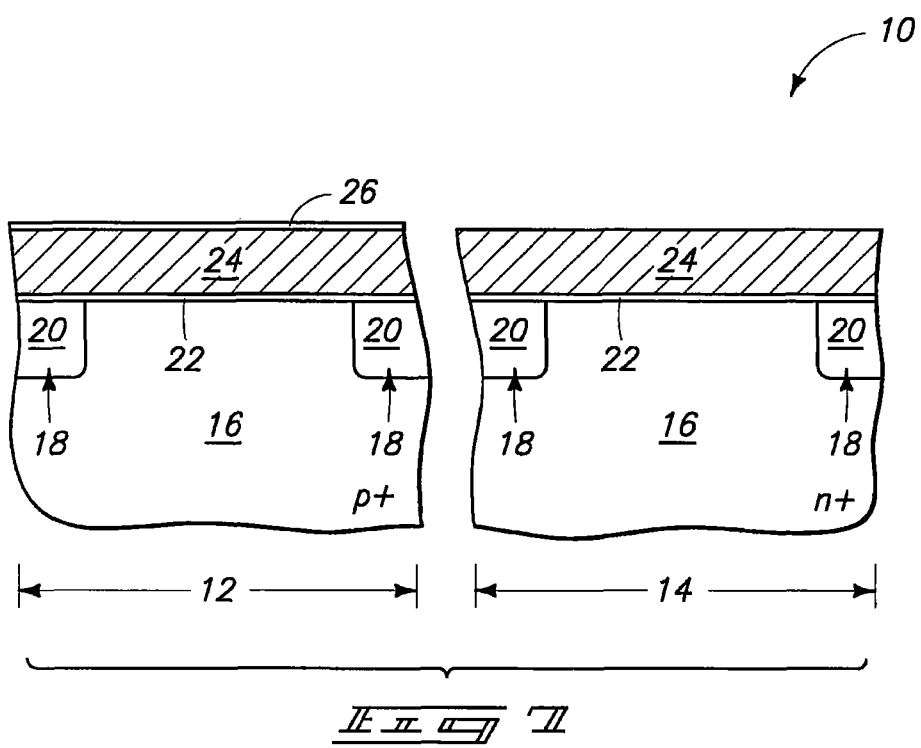
FIG. 7 is a view of the fragments of FIG. 1 shown at a processing stage subsequent to that of FIG. 6.

Referring to FIG. 7, the silicon-containing material 26 is thinned with a suitable etch. In typical aspects of the invention, such etch will utilize tetramethylammonium hydroxide (TMAH), and can be conducted with a dip into a TMAH solution. The TMAH can be utilized at a concentration of from about 8% to about 30% (by weight), with the dip being conducted for a time of from about 10 seconds to about one minute, at a temperature of from about 55° C. to about 65° C.

The TMAH is less aggressive than the ammonium hydroxide utilized for removing silicon-containing material from over the PMOS region, and accordingly the TMAH can be utilized to thin the silicon-containing material 26 over the NMOS region rather than entirely removing such silicon-containing material.

In typical aspects of the invention, the thickness of the silicon-containing material 26 over the NMOS region will be reduced to a final thickness of from greater than 0 angstroms to less than or equal to about 30 angstroms, or in other words will be reduced to a final thickness of from about one monolayer to less than or equal to a few monolayers.

The exposure to the TMAH can convert the silicon-containing material 26 to a silicon oxide, as well as thinning the material 26. If a silicon oxide is formed, such can comprise, consist essentially of, or consist of $SiO_x$, where "x" is greater than 0 and less than or equal to 2. The silicon oxide can correspond to silicon dioxide ($SiO_2$) if sufficient oxygen is incorporated into material 26. If less oxygen is incorporated into material 26, the silicon-containing material can be converted to an oxide corresponding to $SiO_x$, where "x" is greater than 0 and less than 2.

The silicon-containing material 26 is so thin at the processing stage of FIG. 7 that the insulating properties associated with silicon oxides are not problematic relative to subsequent incorporation of silicon-containing material 26 between conductive materials of a transistor gate stack (discussed below with reference to FIG. 10). However, properties of silicon-containing material 26 affect the work function of a transistor comprising the gate stack, and accordingly the invention also includes aspects in which the thin silicon-containing material is not oxidized, but rather consists essentially of, or consists of either silicon or conductively-doped silicon. If thinned material 26 is conductively-doped, it can be majority doped with either n-type dopant or p-type dopant.

Figure 8:
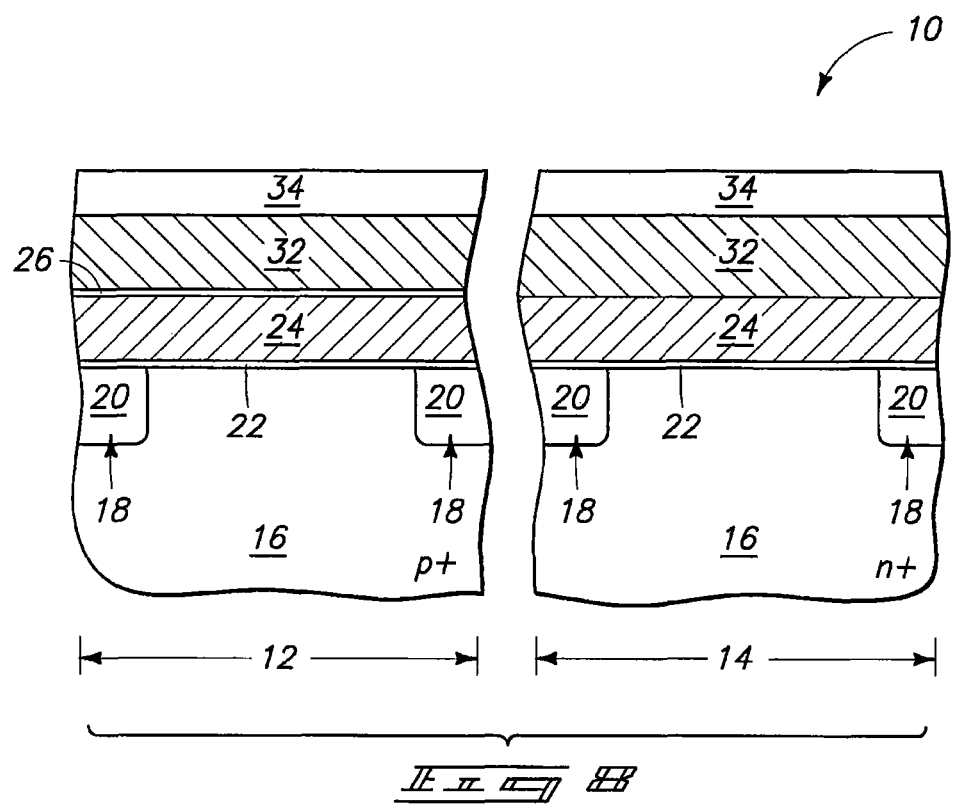
FIG. 8 is a view of the fragments of FIG. 1 shown at a processing stage subsequent to that of FIG. 7.

Referring to FIG. 8, electrically conductive material 32 is formed across the NMOS and PMOS regions of segments 12 and 14, respectively; and electrically insulative material 34 is formed over the conductive material, and also across the NMOS and PMOS regions.

The electrically conductive material 32 can comprise any suitable composition or combination of compositions. In some aspects, material 32 can comprise, consist essentially of, or consist of metal nitride, such as, for example, one or both of titanium nitride and tungsten nitride. Alternatively, or additionally, material 32 can comprise elemental metal, or conductively-doped semiconductor material. In some aspects, material 32 can comprise a lower layer consisting essentially of, or consisting of metal nitride; and an upper layer consisting essentially of, or consisting of elemental metal (for instance tungsten) or metal alloy.

If electrically conductive material 32 comprises metal nitride, such material can be referred to as a second metal nitride-containing material to distinguish it from the first metal nitride-containing material 24. In aspects in which materials 32 and 24 are both metal nitride-containing materials, the materials 32 and 24 can be compositionally the same as one another; or can be compositionally different from one another. In some aspects, material 32 consists of titanium nitride, and is formed to a thickness of from about 300 angstroms to about 400 angstroms.

Conductive material 32 is directly against conductive material 24 over the PMOS region of segment 14, and is spaced from conductive material 24 by the intervening thin silicon-containing material 26 over the NMOS region of segment 12.

Electrically insulative material 34 ultimately corresponds to an insulative cap over a transistor gate stack, and can comprise any composition or combination of compositions suitable for such purpose. In some aspects, material 34 can comprise, consist essentially of, or consist of one or both of silicon dioxide and silicon nitride.

Figure 9:
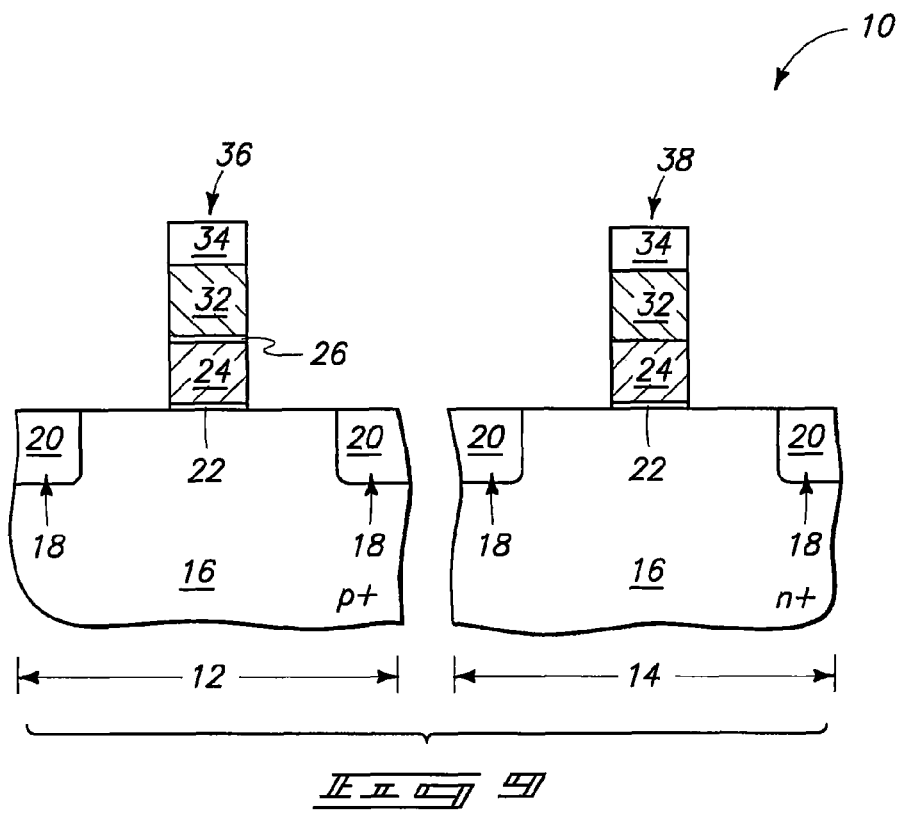
FIG. 9 is a view of the fragments of FIG. 1 shown at a processing stage subsequent to that of FIG. 8.

Referring to FIG. 9, materials 22, 24, 26, 32 and 34 are patterned into a transistor gate stack 36 over the NMOS region of segment 12; and materials 22, 24, 32 and 34 are patterned into a transistor gate stack 38 over the PMOS region of segment 14. The patterning of gate stacks 36 and 38 can be accomplished by, for example, forming photolithographically patterned photoresist masks (not shown) over regions where the gate stacks are to be formed; removing portions of materials 22, 24, 26, 32 and 34 that are not protected by the photoresist masks; and subsequently removing the photoresist masks to leave the shown gate stacks 36 and 38.

Figure 10:
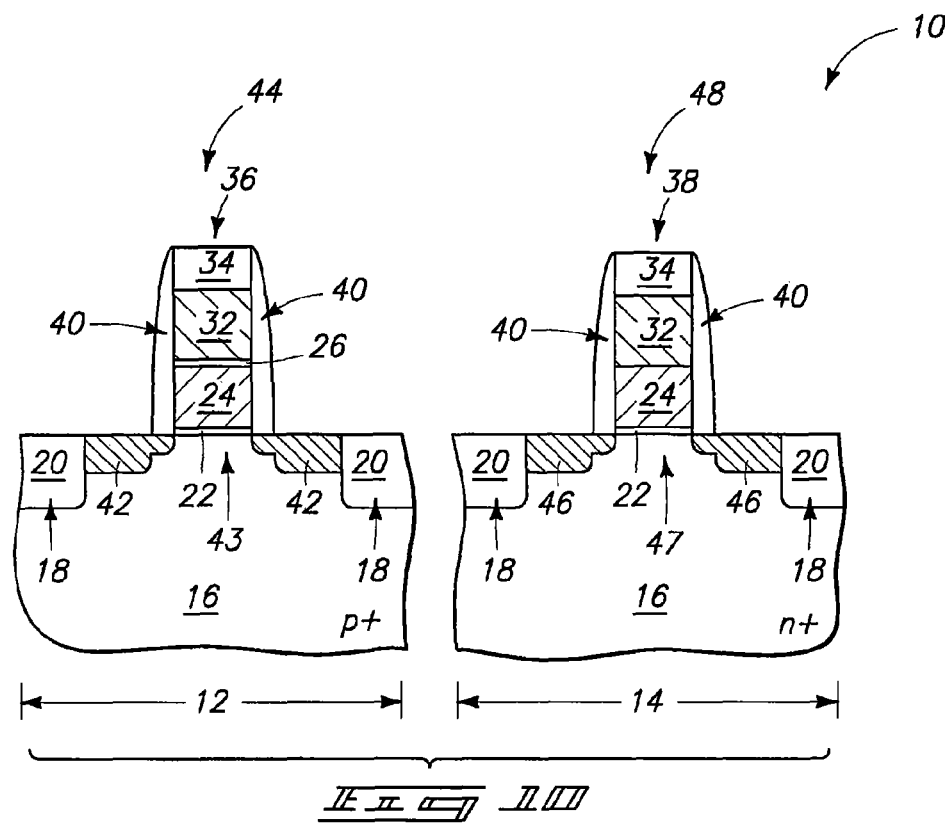
FIG. 10 is a view of the fragments of FIG. 1 shown at a processing stage subsequent to that of FIG. 9.

Referring to FIG. 10, sidewall spacers 40 are formed along sidewalls of gate stacks 36 and 38. Such sidewall spacers can be simultaneously formed along sidewalls of both gate stacks by forming a layer of material 40 over segments 12 and 14, and subsequently anisotropically etching the layer to form the sidewall spacers. Sidewall spacers 40 can comprise any suitable composition or combination of compositions, and in particular aspects will comprise, consist essentially of, or consist of one or both of silicon dioxide and silicon nitride.

N-type doped source/drain regions 42 are formed within substrate 16 on opposing sides of transistor gate stack 36 and separated from one another by a channel region 43 within the substrate under the gate stack. The transistor gate stack, together with the source/drain regions and channel region, forms an NMOS transistor 44.

P-type doped source/drain regions 46 are formed within substrate 16 on opposing sides of transistor gate stack 38, and separated from one another by a channel region 47 within the substrate under the gate stack. The transistor gate stack, together with the source/drain regions and channel region, forms a PMOS transistor 48.

An advantage of the present invention is that numerous materials of the NMOS transistor and the PMOS transistor are formed and patterned simultaneously. However, utilization of the thin silicon-containing material 26 within the NMOS transistor gate stack enables a work function of such gate stack to be tailored to have desired NMOS properties.

In particular aspects of the present invention, the construction of FIG. 10 can be understood to comprise an NMOS transistor 44 having a gate stack containing a segment consisting of, in ascending order from the substrate, metal nitride-containing material 24, silicon-containing material 26, and metal nitride-containing material 32. In such aspects, the silicon-containing material 26 can consist essentially of, or consist of silicon, conductively-doped silicon, or silicon oxide.

The construction of FIG. 10 can also be understood to comprise a PMOS transistor 48 having a gate stack containing a segment consisting of, in ascending order from the substrate, the metal nitride-containing material 24, and the metal nitride-containing material 32. As discussed previously, the metal nitride-containing materials 24 and 32 can comprise the same compositions as one another, or can differ from one another in composition.

An anneal can be conducted before or after formation of source/drain regions 42 and 46. Such anneal can, for example, comprise maintaining segments 12 and 14 at a temperature of about 700° C. for about 30 minutes, followed by maintaining the segments at a temperature of about 800° C. for about 30 minutes. In particular aspects, at least one of the anneals is conducted prior to formation of second conductive material 32 (in other words, prior to the processing stage of FIG. 8); and in some aspects, at least one of the anneals is conducted prior to thinning of silicon-containing material 26 (in other words, prior to the processing stage of FIG. 7).

Although the aspect of the invention described herein etched the silicon-containing material 26 from over the PMOS region prior to the thinning of the silicon-containing material over the NMOS region, it is to be understood that the invention also includes aspects in which the thinning of the silicon-containing material over the NMOS region occurs before the removal of the silicon-containing material from over the PMOS region. In such aspects, the silicon-containing material over the PMOS region can be protected with a photoresist mask during the thinning of the silicon-material over the NMOS region by exposure to TMAH, or can be exposed to the TMAH and thinned while the silicon-containing material over the NMOS region is thinned. Regardless, the thinned material over the NMOS region can subsequently be protected by a mask while the silicon-containing material over the PMOS region is removed.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor construction, comprising:
   a semiconductor substrate having a PMOS region and an NMOS region;
   an NMOS gate stack over the NMOS region; the NMOS gate stack comprising a vertical segment having a silicon-containing material between a first metal nitride composition and a second metal nitride composition; the silicon-containing material being less than or equal to about 30 angstroms thick; and
   a PMOS gate stack over the PMOS region; the PMOS gate stack comprising a vertical segment having the first metal nitride composition and the second metal nitride composition, with the second metal nitride composition being directly against the first metal nitride composition.

2. The construction of claim 1 wherein the silicon-containing material consists essentially of silicon.

3. The construction of claim 1 wherein the silicon-containing material consists essentially of conductively-doped silicon.

4. The construction of claim 1 wherein the silicon-containing material consists essentially of a silicon oxide.

5. The construction of claim 1 wherein the first metal nitride composition consists essentially of one or both of titanium nitride and tungsten nitride.

6. A semiconductor construction, comprising:
   an NMOS gate stack supported by a monocrystalline silicon wafer; the NMOS gate stack comprising a vertical segment consisting of, in ascending order from the wafer: gate dielectric, first metal-containing material, silicon-containing material, and second metal-containing material; the silicon-containing material being less than or equal to about 30 angstroms thick and not comprising metal;
   a channel region within the substrate adjacent the gate dielectric;
   a pair of conductively-doped source/drain regions gatedly connected to one another through the channel region; the NMOS gate stack, channel region and source/drain regions together being comprised by an NMOS transistor; and
   wherein the first metal-containing material includes one or both of titanium and tungsten.

7. The construction of claim 6 wherein the first metal-containing material is a metal nitride, and wherein the second metal-containing material is not a metal nitride.

* * * * *